United States Patent
Memarzadeh et al.

(10) Patent No.: US 12,001,762 B2
(45) Date of Patent: Jun. 4, 2024

(54) METHOD FOR PERFORMING WELL PERFORMANCE DIAGNOSTICS

(71) Applicant: ExxonMobil Technology and Engineering Company, Spring, TX (US)

(72) Inventors: Mahsa Memarzadeh, Spring, TX (US); Justin A. Gantt, St. John's (CA); Ted A. Long, Spring, TX (US)

(73) Assignee: ExxonMobil Technology and Engineering Company, Spring, TX (US)

( * ) Notice: Subject to any disclaimer, the term of this patent is extended or adjusted under 35 U.S.C. 154(b) by 751 days.

(21) Appl. No.: 16/720,195

(22) Filed: Dec. 19, 2019

(65) Prior Publication Data

US 2020/0202047 A1 Jun. 25, 2020

Related U.S. Application Data

(60) Provisional application No. 62/783,758, filed on Dec. 21, 2018.

(51) Int. Cl.
G06F 30/13 (2020.01)
G06N 5/04 (2023.01)

(52) U.S. Cl.
CPC ............. *G06F 30/13* (2020.01); *G06N 5/04* (2013.01)

(58) Field of Classification Search
CPC .................................. G06F 30/13; G06N 5/04
USPC ....................................................... 703/9, 10
See application file for complete search history.

(56) References Cited

U.S. PATENT DOCUMENTS

| | | |
|---|---|---|
| 8,688,426 B2 | 4/2014 | Al-Shammari |
| 8,731,892 B2 | 5/2014 | Al-Shammari |
| 2013/0035919 A1* | 2/2013 | Al-Shammari ......... G06F 30/20 703/10 |

(Continued)

FOREIGN PATENT DOCUMENTS

| | | | | |
|---|---|---|---|---|
| CA | 2555170 C | * | 8/2011 | ........... E21B 43/121 |
| WO | WO-2008054610 A2 | * | 5/2008 | ............. E21B 43/00 |

OTHER PUBLICATIONS

Zhuoyi Li (Interpreting Horizontal Well Flow Profiles and Optimizing Well Performance by Downhole Temperature and Pressure Data, (24 pages). (Year: 2010).*

(Continued)

*Primary Examiner* — Andre Pierre Louis
(74) *Attorney, Agent, or Firm* — ExxonMobil Technology and Engineering Company—Law Department

(57) ABSTRACT

The methods disclosed herein are directed to an automated method for monitoring performance of a well in a hydrocarbon reservoir for continuous monitoring of well test production data for a plurality of well system performance parameters, trending actual performance parameter deviations from a well system model, and determining most probable root cause(s) of the performance parameter deviations based on the trend of the deviations of a plurality of parameters for an outflow component of a well performance model and a plurality of parameters inflow component of a well performance model. The method automatically notifies an operator of detected root causes of the performance degradation, and further may perform corrective action in the well system based on at least one root cause of the deviation determined by the well performance model.

18 Claims, 4 Drawing Sheets

(56) References Cited

U.S. PATENT DOCUMENTS

| | | | |
|---|---|---|---|
| 2014/0180658 A1 | 6/2014 | Rossi et al. | |
| 2015/0378052 A1* | 12/2015 | Al-Ajmi | G06F 17/10 |
| | | | 703/2 |
| 2018/0181693 A1* | 6/2018 | Yang | G06F 30/20 |
| 2019/0266294 A1* | 8/2019 | Dogru | E21B 47/107 |

OTHER PUBLICATIONS

Ashton, P. et al. (2017) "Production Optimization of Shenzi Field in the Deepwater Gulf of Mexico," *Society of Petroleum Engineers*, SPE-187256-MS.

\* cited by examiner

METHOD FOR PERFORMING WELL PERFORMANCE DIAGNOSTICS

CROSS REFERENCE TO RELATED APPLICATIONS

This application claims the priority benefit of U.S. Provisional Patent Application No. 62/783,758, filed Dec. 21, 2018, entitled METHOD FOR PERFORMING WELL PERFORMANCE DIAGNOSTICS.

FIELD

Herein disclosed are methods related to performing well system performance diagnostics of oil production wells. More particularly, herein disclosed are methods for continuous monitoring of well system performance parameters, trending actual performance parameter deviations from a base well performance model, and determining root causes of the performance parameter deviations.

BACKGROUND

This section is intended to introduce various aspects of the art, which may be associated with exemplary embodiments of the present techniques. This discussion is believed to assist in providing a framework to facilitate a better understanding of particular aspects of the present techniques. Accordingly, it should be understood that this section should be read in this light, and not necessarily as admissions of prior art.

The flow of hydrocarbon fluids from oil and gas reservoirs to the surface along a production well or injection well (or "well" or "well system" herein unless otherwise noted) is generally divided into two regimes: fluid flow from the reservoir porous rock to the well through down-hole completions that allow entry to the well, and subsequently from the down-hole entry point up and along the tubing of the well to surface pipeline and processing facilities. Well performance models are known in the art and are widely used to describe the above two fluid paths. Inputs to such models include reservoir, completions, well geometry, subsurface equipment, artificial lift, and fluid properties. Well models can contribute to better, more efficient, and fit for purpose design of various components of both production and injection wells. Moreover, once the well is drilled and put into production/injection, well models can be used to predict the performance of the well based on changes in the well model parameters either independently or thru coupling with reservoir simulation models. For this type of application, well models are generally maintained by regularly calibrating the model to actual well production data to ensure that the models remain representative of the well performance at all times.

U.S. Pat. No. 8,688,426 B2 to Al-Shammari and U.S. Pat. No. 8,731,892 B2 to Al-Shammari illustrate specific methods for the common practice of updating the well models to continually conform to the actual well performance. In this manner, the well model parameters are updated so the model remains an accurate performance representation of the actual production well system. However, the Al-Shammari patents are not directed to, nor can be used for root cause detection, and in fact, due to these updates in the well system model, will lose the capabilities for root cause detection as the models are progressively updated to incorporate in the updated model the deviations that may be associated with degradation in one or more well system parameters.

Besides being utilized to predict well performance based on changes of the well parameters in the model, well performance models have also been used to aid in the prediction of root causes of deviations in the actual well performance from those predicted by the model.

One such method is disclosed in U.S. Patent Publication No. US 2014/0180658 A1 to Rossi et al. This method uses a thermal-hydraulic production system model to generate "feature vectors" corresponding to performance degradation root causes. In other words, this method relies on producing a thermal-hydraulic production system model that predicts the effects of various performance root causes over the entire space of feature vectors. 'Classifiers' are then utilized to determine the most likely fit of the actual performance data with the various "root cause" models. This method requires updates of the model as well as the classifier as needed if the dynamics of the system changes. This results in a well performance model system that requires a high level of maintenance and updating and can result in improper root cause detection if updates are not performed or are performed incorrectly.

Another method for analyzing asphaltene deposition and gas lift performance is disclosed in publication SPE-187256-MS "Production optimization of Shenzi Field in the Deepwater Gulf of Mexico" (P. Ashton et al., Society of Petroleum Engineers, 2017). However, this method requires the comparison of data from 2 separate sections of the well, generally a "non-affected" upper section (with known characteristics, such a no asphaltene deposition) to determine the unknown extent of the separate "affected" lower sections on asphaltene deposition (i.e., "effective tubing ID reduction"). As well as having the drawback of having to have data from "known/non-affected" sections of the same well, this process is also limited to analyzing only two (2) possible problems in the system (i.e., asphaltene deposition and gas lift performance).

Therefore, there exists in the industry a method for determining well system performance and identifying performance degradation in a multitude of well system parameters including both well parameters (such as tubing restrictions, artificial lift gas deficiencies, holes in tubing, liquid loading, or downhole pump deficiencies), as well as near well reservoir parameters (such as increase in skin, reduction in permeability, reservoir pressure loss, restrictions in perforations, changes in partial penetrations, and changes in the effective length of the completion) by using a simple, automated, real-time analytic tool, that requires minimal downhole instrumentation and/or well testing for use in production well systems utilized in oil or gas production.

SUMMARY

According to disclosed aspects, an automated method is provided for monitoring performance of a well system in a hydrocarbon reservoir and detecting performance degradation events in a well in the well system. The method comprises:
   a) inputting well test production data into a well performance model, the well performance model comprised of model parameters, the model parameters comprising one or more reservoir properties, the well performance model further comprising
      an inflow component modeling a pressure drop for hydrocarbon fluids flowing from a reservoir to the well, and an outflow component modeling a pressure drop for hydrocarbon fluids flowing in and along tubing in the well to a surface;

b) calculating a downhole model pressure based on the well performance model;

c) comparing the calculated downhole model pressure with a measured downhole pressure;

d) determining if there is a deviation between the calculated downhole model pressure and the measured downhole pressure, and if there is a deviation, performing an analysis, by the well performance model, on the model parameters to determine one or more potential attributing root causes for the deviation; and e) inferring from the analysis on the plurality of parameters one or more causes of the deviation.

BRIEF DESCRIPTION OF THE DRAWINGS

The advantages of the present techniques are better understood by referring to the following detailed description and the attached drawings, in which.

DETAILED DESCRIPTION OF THE EMBODIMENTS

Figure 1:
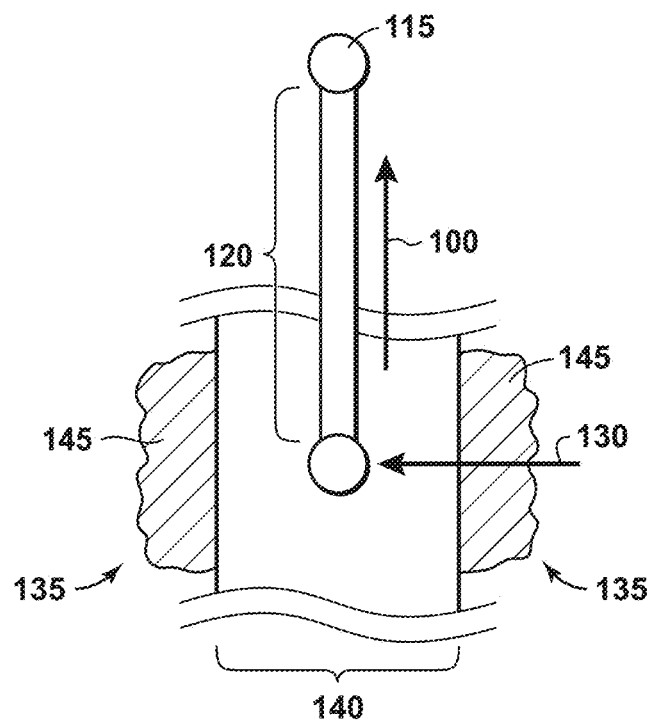
FIG. 1 illustrates a simple schematic of key parameters of a well system utilized in the computational methodologies herein.

In the following detailed description section, specific embodiments of the present techniques are described. However, to the extent that the following description is specific to a particular embodiment or a particular use of the present techniques, this is intended to be for exemplary purposes only and simply provides a description of the exemplary embodiments. Accordingly, the techniques are not limited to the specific embodiments described below, but rather, include all alternatives, modifications, and equivalents falling within the true spirit and scope of the appended claims.

Following is a list a definitions for specific terms utilized in the present disclosure. For terms that are not specifically defined in this section, these terms have meaning as utilized by those of skill in the art common in the applicable field/industry.

"Production well"—A well drilled into the ground to produce hydrocarbon resources.

"Injection well"—A well drilled into the ground to inject water or gas into underground layers. Such injection may assist with the recovery of hydrocarbon resources, dispose of fluids in a separate reservoir, or may be used for other purposes.

"Production well system"—Equipment and hardware associated with a production well.

"Injection well system"—Equipment and hardware associated with one or more injection wells.

"Well system"—Equipment and hardware associated with a well. This can include components and parameters associated with a well for producing hydrocarbons, such as, but not limited to a production well; an injection well; associated equipment and hardware; as well as the equipment; hardware, and reservoir properties/parameters.

"Well performance model"—A model that determines the production of a well as a function of its configuration parameters, reservoir and fluid properties, and pressure drops.

"Tubing restrictions"—Obstruction of fluid flow in the tubing string of wells, due to deposition of solids such as wax and asphaltene. This phenomenon reduces the effective inner diameter of the tubing string from its original value.

"Gas lift"—An artificial lift technique to improve hydrocarbon recovery. It relies on injecting gas into a well to reduce the average fluid density of fluid in the well, thus reducing the pressure required to overcome the effects of gravity in the well. One implementation of gas lift is to inject gas into the deepest possible entry point of hydrocarbon fluids into the well.

"Downhole pressure"—Pressure measured at some point along the bottom of the tubing usually above the completion interval, where the well connects to the reservoir.

"Surface/well head pressure"—Pressure measured at the tubing head point.

"Perforations"—Holes formed into the casing or the liner of the well to fluidly connect the well to the reservoir.

"In-well" and "Near-well"—In and along the tubing string vs. the outside in the perforation zone where the reservoir connects to the well.

"Penetration" and "Partial penetration"—Penetration of the perforation zone into the thickness of the reservoir sand. Full vs partial penetrations are defined in this context.

"Effective length of the completion"—The length that is in actuality contributing to production/injection.

"Sand migration"—The movement of sand along with the hydrocarbon fluids into the near-well zone of the reservoir due to reduced pressures in this zone, during production. The sand can potentially clog the entry points of the fluids into the well in the perforation zone. This situation is characterized by 'skin damage'.

"Liquid rate"—The volume per unit time of liquid flowing in a well.

"Water cut (wct)"—The volume fraction of water in the liquid rate as described above.

"Gas oil ratio (gor)"—The volume of gas divided by the volume of oil in a hydrocarbon producing well.

"Reservoir pressure"—The pressure of the fluids within the pores of a reservoir.

"Skin factor"—A dimensionless representation of the additional pressure drop, due to near-well damages, for fluid flow communication between the reservoir and a well.

"Production uplift"—The additional rate of hydrocarbon production that can be achieved by remediating an identified in-well or near-well problem, in a producing well.

"Mature well"—A well that has been in production or operation long enough for past well performance issues or deviations to be identified. An "immature well" is a well that is not a mature well.

The utility and purpose of the methods and systems disclosed herein is a simplistic, reliable, automatic and real-time approach for use of well production models to monitor the performance of wells using a real-time method and associated systems. Unlike most related work in this area, whose focus is on generating and maintaining well models representative by continuously calibrating them to field data, the goal of this invention is to diagnose potential well performance degradation reasons, due to which, a well model once representative of production performance, may become unrepresentative gradually and over time. Improvements provided in the methods and systems disclosed herein include techniques which do not require any historic performance degradation events of the past to train the system. Instead, the methods herein rely on continuous contrasting of well models with real-time production data and performing monitoring and temporal trend analysis of performance degradation potential root causes. Additionally, the methods and systems disclosed herein do not require building, maintaining models developed to simulate the effects of each separate possible root cause, nor do the methods and systems disclosed herein require complex, multi-positioned downhole instrumentation (such as multiple downhole pressure gauges) nor rely on comparison of on section of the well (experiencing performance deficiencies in a particular parameter) to another section of a well (not experiencing performance deficiencies in a particular parameter) to enable determinations of the root cause and its magnitude (such as in SPE-187256-MS discussed in the Background section above). Such techniques (as in SPE-187256-MS) require a multitude of downhole instrumentation (to segregate the system into at least two sections for comparison), but also rely on the assumption that the amount of degradation in each section can be accurately quantified (thus allowing the delta or subtractive technique as disclosed in SPE-187256-MS to be utilized).

The preset methods enable one or more of the following in well performance monitoring and analysis:
  Monitoring of the well performance automatically and in real-time for potential degradation events
  Diagnosis of performance degradation potential causes
  Quantification of production/injection uplift resulting from fixing detected problems
  Notification of asset engineers and operators to trigger a corrective action when it is determined necessary.

The well performance management methods herein may further include the input into the well performance system or model any one or combination of the possible root causes for the calculation of the deviations associated with performance degradation of the outflow component of the well system, including at least one of:
  restrictions in tubing impacting the tubing effective internal diameter;
  localized restriction in tubing due to scale build-up within the tubing;
  inefficiencies in an artificial lifting equipment or operation;
  holes in tubing;
  excessive liquid loading in the well system; and
  problems with a lift pump.

Such performance indicators are represented by the model parameters in set X.

The well performance management methods herein may further include the input into the well performance system or model any one or combination of the possible root causes for the calculation of the deviations associated with performance degradation of the inflow component of the well system, including at least one of:
  increase in skin value;
  reduction in permeability;
  reduction of reservoir pressure;
  restrictions in perforations;
  changes in partial penetration; and
  changes in effective length of completions.

Such performance indicators are represented by the model parameters in set Y.

The methods herein may further include, based on at least one root cause of the deviation determined by the well performance model, performing a corrective action in the well system.

The well performance management methods herein may further include any of the following in-well corrective actions to be taken on a well system based on the diagnosis, quantification, and/or notification:
  Chemically treating a well/tubing (injecting chemicals to dissolve wax/scale/etc.) or mechanical treatment (scraping off wax/etc. by using coiled tubing)
  Changing a gas lift valve setting/position
  Adjusting of an injection rate or pressure (in an injection well)
  Blocking off or partially restricting a perforation in the well bore or tubing
  Opening or partially opening a blocked perforation in the well bore or tubing
  Patching a hole in the tubing
  Providing artificial lift of a loaded liquid in the well
  Replacing or repairing a downhole pump The well performance management methods herein may further include any of the following in-well corrective actions to be taken on a well system based on the diagnosis, quantification, and/or notification:
  Acid treating at least a portion of the well
  Increasing the reservoir pressure by increasing an injection fluid rate (via an injection well)
  Decreasing the reservoir pressure by decreasing an injection fluid rate (via an injection well)
  Perforating or re-perforating at least a portion of the well
  Fracturing or re-fracturing at least a portion of the well
  Removing/controlling the sand migration The techniques disclosed here rely on a production well model consisting of two components: an outflow component that models the flow of fluids along the tubing from downhole region to the well surface region, and an inflow component that models fluid flow from the reservoir to the down-hole region of the well through the completions. It should be noted that while these methods are described herein with respect to production wells, a similar model analysis can be used on injection wells by utilizing well performance models that model the flow of fluids along the tubing from the well surface region to the down-hole region (in a similar manner as to the "outflow component" described herein in the context of a production well), and models the fluid flow from the down-hole region of the well to the reservoir (in a similar manner as to the "inflow component" described herein in the context of a production well).

The present techniques will be illustrated herein with respect to a production well as follows. FIG. 1 illustrates wherein the outflow component 100 of the model constitutes the flow of fluids along the tubing 105 from a down-hole region (or completion) 110 (only one illustrated in FIG. 1) to the well surface (or well-head) region 115. Element 120 shows the region of modeling/interest in the outflow component model.

In FIG. 1, the inflow component 130 of the model constitutes the fluid flow from the reservoir 135 to the down-hole region of the well through the down-hole region (or completion) 110. Element 140 illustrates the region of the wellbore or well casing within the reservoir 135. Element 145 (regions encompassed in dashed line) shows the region of modeling/interest in the inflow component model.

Figure 2:
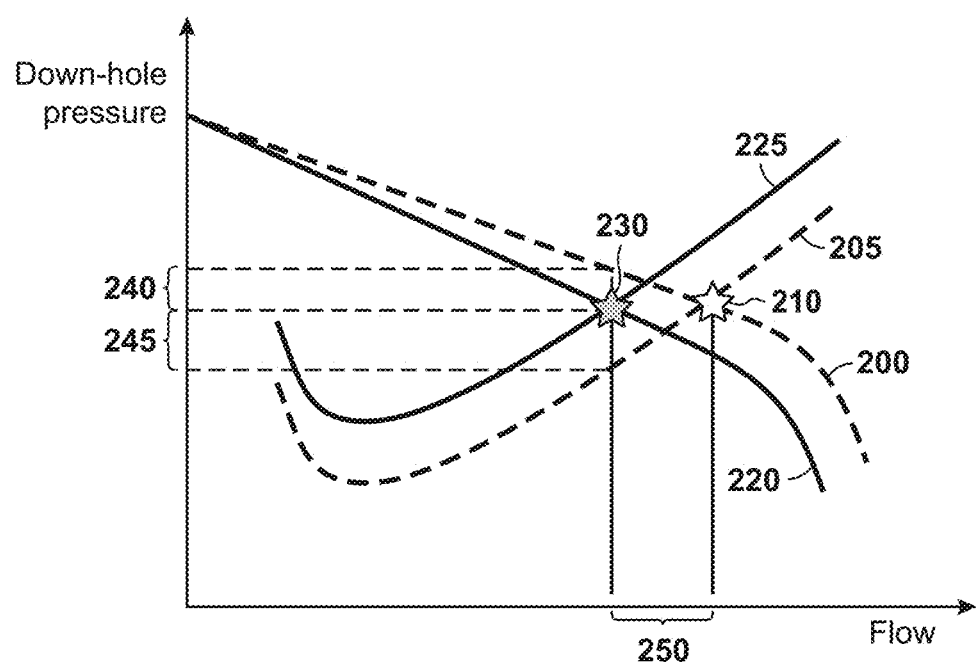
FIG. 2 illustrates the intersection of outflow and inflow performance curves for a representative (or "base") well performance model and for a tuned well performance model.

The theoretical operating point of a well is known to be at the intersection of such outflow and inflow performance curves that are derived from the outflow and inflow performance models. This is illustrated in FIG. 2 wherein 200 shows the performance curve (downhole pressure vs. flow) for the base inflow model and 205 shows the performance curve for the base outflow model. The intersection of these two performance curves is the theoretical operating point 210 for the base well performance diagnostics (WPD) model. In a tuned model from the well performance diagnostics methods disclosed herein, 220 shows the performance curve (downhole pressure vs. flow) for the tuned inflow model and 225 shows the performance curve for the tuned outflow model. The intersection of these two performance curves is the theoretical operating point 230 for the tuned WPD model. Deviations from the base WPD model curves to the tuned WPD model curves are attributable to inflow and/or outflow degradation root causes.

As is further illustrated in FIG. 2, the quantity of the difference in the inflow pressures ($\Delta p_{inflow}$) between the base WPD model and the tuned WPD model can be quantified as shown in the range, $\Delta p_{inflow}$, shown in element 240. Similarly, the quantity of the difference in the outflow pressures ($\Delta p_{outflow}$) between the base WPD model and the tuned WPD model can be quantified as shown in the range illustrated by element 245. The overall uplift potential, i.e., the amount of additional flow through the well system that may be achieved by eliminating or correcting all performance deficiencies, can be quantified as shown in the range illustrated by element 250 in FIG. 2.

As previously noted, the disclosed methods do not require large amounts of down-hole data or multiple well performance models. This makes the disclosed methods very easily adaptable to most well systems. Because the methods herein do not involve section segregation and comparison of the performance in multiple sections of the well, the disclosed methods can be used with readings from only one down-hole pressure gauge (even though it may be used with multiple down-hole pressure gauges as well). This is valuable since many wells only have a single down-hole pressure gauge, or often, even if there is more than a single down-hole pressure gauge, one or more of the pressure gauges may be non-functional or reading inaccurately.

Data parameters (or "Production Data" herein) that are utilized in the methods herein include the following:
Down-hole pressure ($P_G$)
Surface/well-head pressure (WHP) and temperature (WHT)
Liquid rate ($q_1$)
Water cut (WCT)
Gas-to-oil ratio (GOR)
Gas lift rate for producer wells, if applicable ($q_{g1}$)
These data parameters may be measured on well systems either in real-time or during scheduled flowing well tests.

The Reservoir Properties that are required for these methods may include the following:
Reservoir pressure (P*)
Reservoir permeability (K)
Near-well damage modeled by a Skin factor (S)

According to disclosed aspect, the known reservoir properties are used in the in-well model and the unknown reservoir properties are to be monitored for well performance using the methods described herein. Such reservoir properties are available on any well system that has a corresponding well performance model. These reservoir properties are generally derived from estimations, an initial reservoir study, or from a more recent periodic reservoir study, such as an automated pressure transient analysis, such as described in U.S. Patent Publication No. US 2018/0100948 A1 to Suzuki, which is incorporated herein by reference.

In the disclosed methods, the outflow component of the well performance model, i.e. modeling pressure drop along the tubing of the well, is a physics-based well hydraulics model, such as a Prosper model. A physics-based outflow model requires as input the relevant details of all the subsurface equipment (for example, well sections along with their geometries and tracks), the PVT properties of the fluids flowing in the well, and the artificial lift design specifications (for example, gas lift designs) for producer wells that are gas lifted. Using this model, the down-hole pressure $P_{outflow}$ as a function of the outflow component rate for a producer well that is gas lifted can be described as:

$$P_{outflow}=f(q_1,q_{g1},WCT,GOR,WHP,WHT,X) \quad \text{(Eq. 1)}$$

where the defined function is the outflow function, and X the set of model parameters that represent performance indicators. In addition to the specified variables, the outflow function may be dependent on other variables as inputs.

This modeling function is well known to one of skill in the art and are generally incorporated into a conventional well performance model. In other embodiments, the well performance model can be a data-driven model.

In one embodiment of the methods herein, the inflow component of the well performance model, i.e., modeling pressure drop from the reservoir to the well (i.e., the down-hole region or completion) is a Darcy model. The down-hole pressure $P_{inflow}$ corresponds to the outflow component rate from the reservoir into the well is formulated as:

$$P_{inflow}=g(q_1,P^*,K,S,Y) \quad \text{(Eq. 2)}$$

where the defined function is the inflow function, and Y the set of model parameters that represent performance indicators. In addition to the specified variables, the inflow function may be dependent on other variables as inputs.

This modeling function is well known to one of skill in the art and is generally incorporated into a conventional well performance model. In other embodiments, the well performance model can be a more detailed completion model, a productivity index (PI) model, or a data-driven model.

Figure 3:
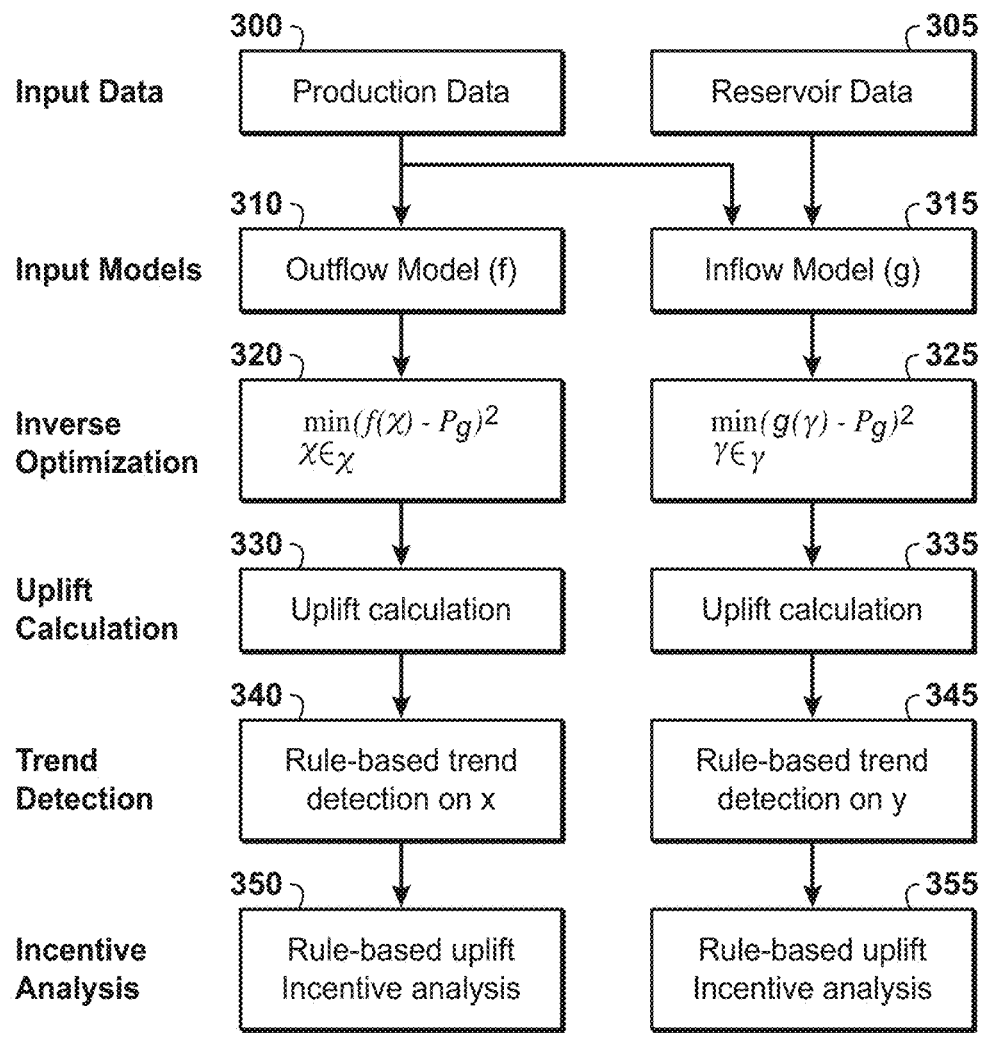
FIG. 3 illustrates a block representative workflow of an embodiment of the methods herein.

With the above assumptions, the well performance monitoring and diagnostics methods herein are implemented by comparing, automatically and using an online system. An online system may be designed to take real-time or near real-time information from instrumentation associated with the well system (such as pressures, flows, temperatures, etc.) on a continuous basis for at least a period of time to provide the necessary trending data analysis used in the systems and models described herein. In preferred embodiments, the online system may present probable root causes of performance degradation to an operator or engineer for considerations on the type and timing of corrective action to be taken in the well system to address the identified causes and provide remediation of the performance degradation. The down-hole pressures from the model are used with the Production Data as described in the following steps and as illustrated in FIG. 3 herein:

Step 1—Obtaining input data to be used in a well performance model. The input data includes the Production Data 300 and the Reservoir Properties 305.

Step 2—Load the well performance model with the input data. The well performance model comprises an Outflow Model (f) 310 and an Inflow Model (g) 315. The well performance model is assumed to have been previously created and proven to be representative of production data at the time of creation. The well performance model may include model parameters such as the geometry of the well, subsurface equipment, artificial lift equipment, fluid properties, and/or other known reservoir properties. The input data loaded into the well performance model includes flow rates, wellhead pressures, and possibly data associated with artificial lift activity. Downhole pressure data, however, is not loaded into the model at this point in the method.

Step 2a. Calculate a downhole model pressure based on well performance model and data received from step 1.

Step 3—Compare measured down-hole pressure data with the down-hole model pressure calculated in Step 2a. Specifically:
a. Compare the down-hole model pressure from the outflow model, $P_{outflow}$, with the down-hole gauge pressure data, 320. If a mismatch is detected, perform a parameter study wherein various parameters of the model are tuned for the model to match the data. Tuning is performed using an inverse optimization formulation that minimizes the squared error between the outflow model and data down-hole gauge pressures. The inverse optimization formulation may be represented by the following equation.

$$\min_{x \in X}(f(x) - P_g)^2 \qquad \text{(Eq. 3)}$$

The set $\chi$, used for this tuning represent the suite of in-well/tubing performance indicator parameters. Note that it is assumed all the other production data have been input into $P_{outflow}$, but $x \in \chi$ represents the variable parameters to be studied.

b. Similarly, if the down-hole model pressure from the inflow model, $P_{inflow}$, is not matching the down-hole gauge pressure data 325, a parameter study is performed to minimize the squared error between the model pressure and pressure data down-hole gauge difference using a similar inverse optimization approach as described above. The set $\gamma$ used for this analysis, represent near-well performance indicator parameters. Here it is also assumed all the other production data have been plugged in to $P_{inflow}$, but $y \in \gamma$ represent the variable parameters to be studied.

$$\min_{y \in \gamma}(g(y) - P_g)^2 \qquad \text{(Eq. 4)}$$

The inverse optimization formulation may be further solved by at least one of the following methods:
point-wise processing of each well test individually; and
time series processing of a sequence of well tests.

Step 4—Monitor temporal trends of the sets of parameters X and Y using a rule based approach for the outflow parameters 340 and the inflow parameters 345, with the parameters rendering consistent trends and realistic ranges being detected as potential performance degradation causes. The system may optionally automatically notify engineers/operators of any diagnosis.

Step 5—For potential degradation root cause parameters in X and Y individually, quantify the production uplift resulting from a fix from the tubing performance indicator parameters 330 and the production uplift resulting from a fix from the near-well performance indicator parameters 335.

Step 6—For diagnosed parameters of Step 5, the system will calculate a rule-based uplift analysis 350 based on the outflow parameters and a rule-based uplift analysis 355 based on the inflow parameters. The system may optionally advise engineers/operators of a recommended corrective action if the production uplift prospect justifies a remediation. Additionally or alternatively, the system may determine a future date at which a parameter may cross a threshold value. The threshold value may be set in the system by the engineer or operator and can represent any type of threshold value (e.g., can be an alarm point, a shut-down point, a required operational procedure deviation point, or a point at which planned corrective actions should be performed).

Alerts from the system may be presented to the engineers and/or operators in real-time for assessment, determination, and coordination of the time and type of corrective action. In case of multiple root causes of the deviation (or where there are multiple possible root causes of the problems, either in tubing or near the well) detected by the system to be likely contributors to the well performance degradation, the engineer/operator's prior experience with the history of the well can additionally be used to determine which problem(s) should be further investigated or remediated.

As a well performance model may be comprised of a large number of parameters, it may be helpful to narrow down the number of parameters that may be responsible for a deviation. For a mature well, performance histories may be used to identify parameters most likely to cause a deviation in the present and future. Therefore, past well performance histories may be used to determine a set of causes for potential well performance deviation. For an immature well or a well with an unknown well performance history, all potential parameters may be considered during initial runs of the disclosed methods, and the number of potential parameters may be reduced based on subsequent well performance analyses and findings.

Figure 4:
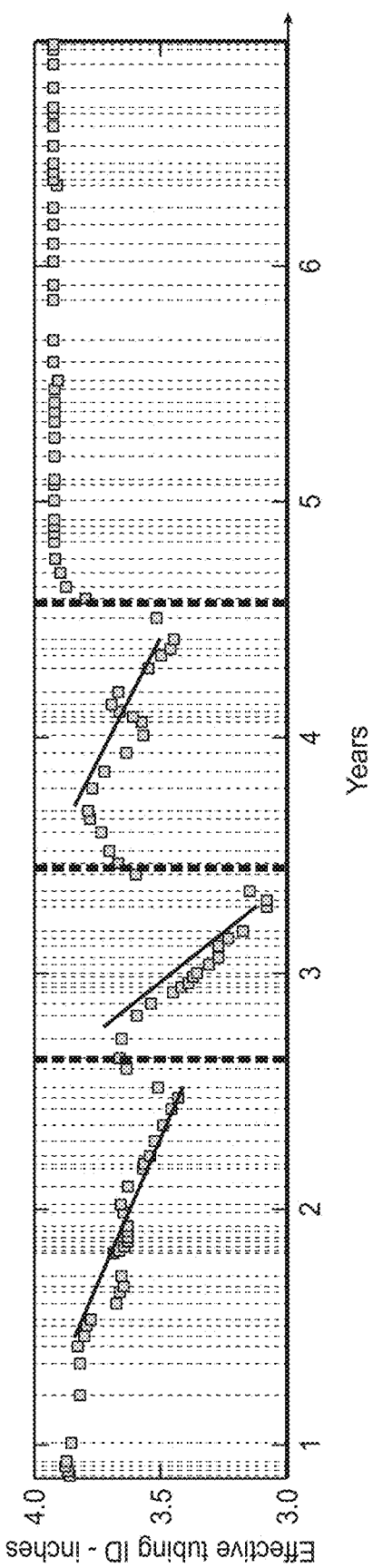
FIG. 4 illustrates an example of the three events of temporal decline trends in tubing internal diameter size identified by utilizing the methods herein which root cause was identified as paraffin build-up in the inner wall of the tubing of the well system and corrected by scraping off of the paraffin.

In the example application of FIG. 4, three events of temporal decline trends in tubing internal diameter size using the above workflow were identified as a diagnosis for paraffin build-up in the inner wall of the tubing. Each of these three events were followed by corrective actions to scrape off the paraffin.

Figure 5:
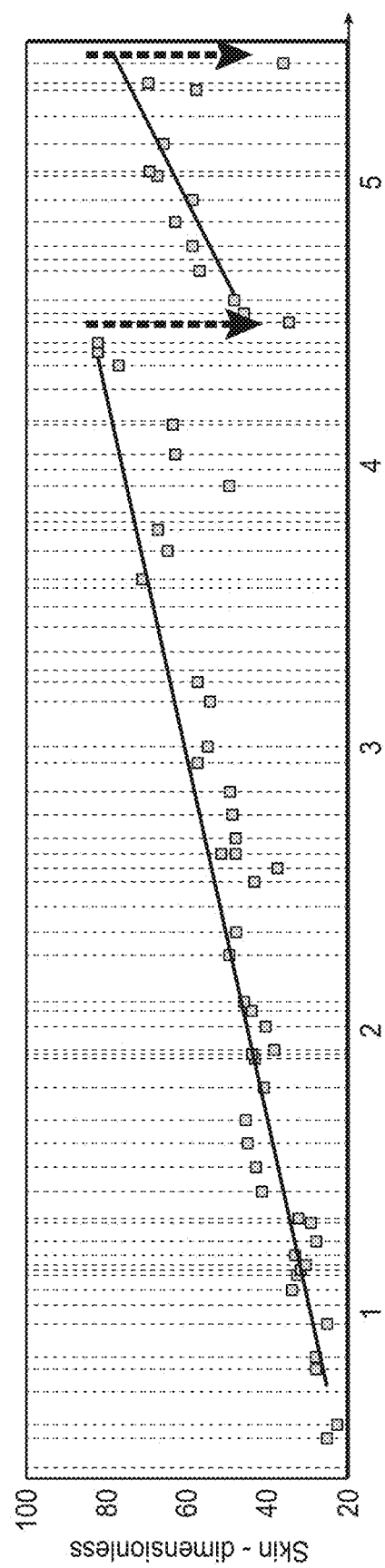
FIG. 5 illustrates two events of temporal increase in the near-well skin identified was identified as a root cause of performance degradation by utilizing the methods herein which were corrected by the utilization of acid stimulation.

In the example application of FIG. 5, two events of temporal increase in the near-well skin were diagnosed. Each of the two events were followed by acid stimulation to fix the damage.

Figure 6A:
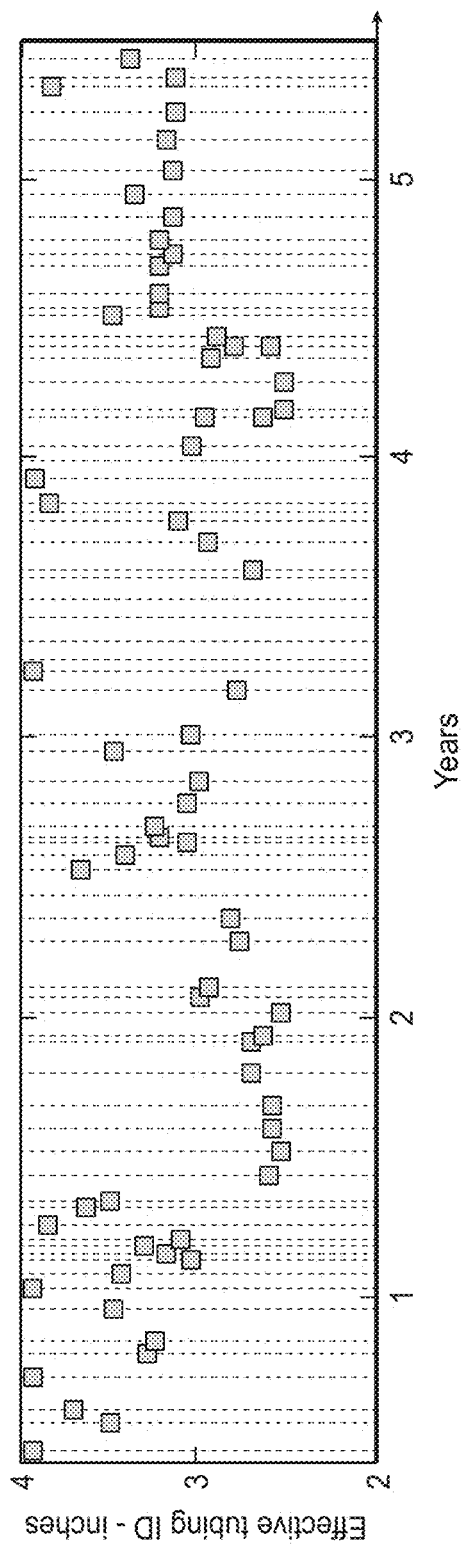
FIG. 6A illustrates the impact of noise in the well test production data impacting the detection of the effective tubing size.

A regularization approach supports Steps 3a and 3b of the workflow above in situations when data is noisy or the model is challenged to represent the data. In these cases no clear trend can be easily noted for parameters that represent performance as shown in FIG. 6A. A regularization based analysis can be done as needed to support the diagnostic when a case of performance degradation is suspected. In this analysis, the inflow and outflow models are tuned to a sequence of well tests (for example, a sequence of operational data obtained since a previous corrective action in the field was executed). The idea behind this type of formulation is to match a sequence of tests to the data, while explicitly looking for degrading trends of inflow and outflow diagnostic parameters x(t) and y(t), respectively. The optimization formulation for this supporting analysis can be described as:

$$\min_{x(t) \in x} \frac{1}{2} \int (f(x(t)) - P_G(t))^2 dt + \varepsilon_1 \int \frac{1}{2}\left(\frac{\partial x(t)}{\partial t}\right)^2 dt \quad \text{(Eq. 5)}$$

$$\min_{y(t) \in y} \frac{1}{2} \int (g(y(t)) - P_G(t))^2 dt + \varepsilon_2 \int \frac{1}{2}\left(\frac{\partial y(t)}{\partial t}\right)^2 dt \quad \text{(Eq. 6)}$$

Figure 6B:
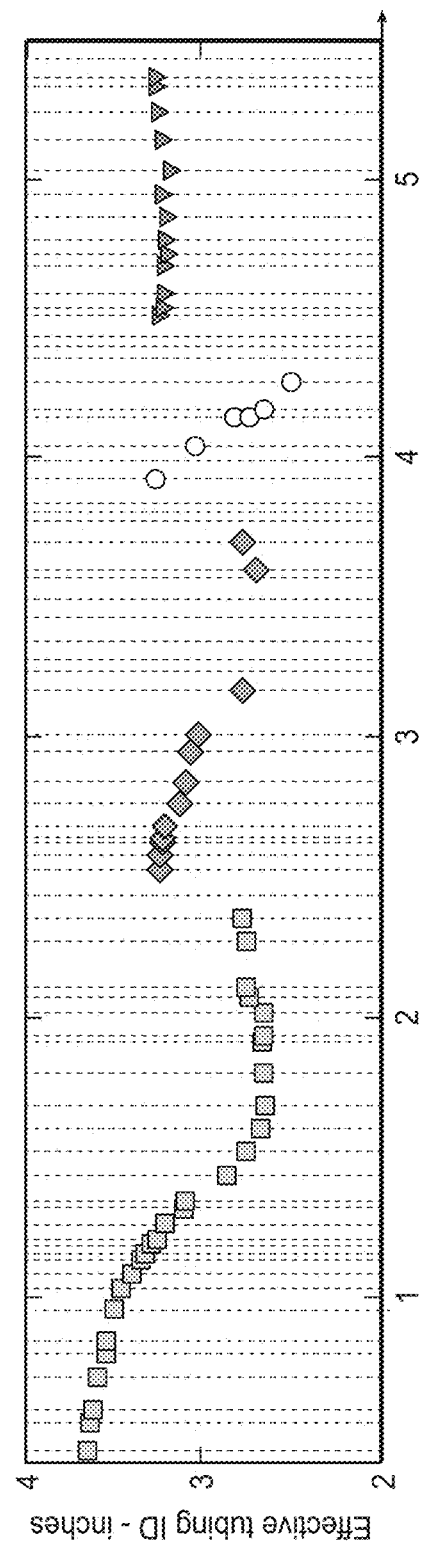
FIG. 6B illustrates the same derivation as in FIG. 6A after the application of optimization formulations disclosed herein to reduce the variations ("noise") in the data by time series processing of the sequence of well test data to assist with the diagnostic.

The terms $$\int \int \frac{1}{2}\left(\frac{\partial x(t)}{\partial t}\right)^2 dt \text{ and } \int \int \frac{1}{2}\left(\frac{\partial y(t)}{\partial t}\right)^2 dt$$

are regularization terms which allow the optimizer to look for parameters x(t) and y(t) that have smooth variations (degradation in this context) with time. The terms $\varepsilon_1$ and $\varepsilon_2$ are coefficients that can be varied to match previous performance degradation events. These coefficients are included to permit Equations (5) and (6) to more accurately detect degradation events which can otherwise remain undetected due to the data noise and model imperfections. FIG. 6B shows the same data after the optimization formula is applied. This example illustrates how such an approach is successful in diagnosing paraffin build-up in the well, which is not evident using a matching technique to individual tests.

These methods for mitigating data noise and model imperfections may be further solved by at least one of the following methods:
point-wise processing of each well test individually; and
time series processing of a sequence of well tests.

The disclosed methods have several advantages over previous modeling attempts. For example, the disclosed method does not require constant or frequent updates to its well performance model, or to its associated parameters. Additionally, a high degree of precision in the well performance model (and its associated parameters) is not required for the method to provide meaningful results. The disclosed methods therefore accomplish well performance analysis with far less required expense and time when compared to known well performance analysis methods.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

What is claimed is:

1. An automated method for well performance management of a well system in a hydrocarbon reservoir and detecting performance degradation events in a well in the well system, comprising the steps of:

a) inputting well test production data into a well performance model, the well performance model comprised of model parameters, the model parameters comprising one or more reservoir properties, the well performance model further comprising
an inflow component modeling a pressure drop for hydrocarbon fluids flowing from a reservoir to the well, and
an outflow component modeling a pressure drop for hydrocarbon fluids flowing in and along tubing in the well to a surface;
b) calculating a downhole model pressure based on the well performance model;
c) continuously comparing the calculated downhole model pressure with a real-time measured downhole pressure;
d) determining if there is a deviation between the calculated downhole model pressure and the real-time measured downhole pressure, and if there is a deviation, performing an analysis, by the well performance model, on the model parameters to determine one or more potential attributing causes for the deviation, wherein the analysis is formulated using an inverse optimization formulation that minimizes the squared error between the down-hole gauge pressures of the inflow component based on the well performance model and the well test production data using the following equation:

$$\min_{y \in y}(g(y) - P_g)^2;$$

e) inferring from the analysis on the plurality of parameters one or more causes of the deviation to improve hydrocarbon resources recovery; and
f) changing a reservoir pressure by increasing an injection fluid rate of an injection well or decreasing the injection fluid rate of the injection well responsive to the inferring one or more causes of deviation.

2. The method of claim 1, wherein step (e) performs separate calculations for computing a deviation in the values of the model parameters relating to the inflow component of the well performance model and the values of the model parameters relating to the inflow component of the well performance model based on well test production data;
computing a deviation in the values of the model parameters relating to the outflow component of the well performance model and the values of the model parameters from the outflow component of the well performance model based on the well test production data; and
independently determining one or more causes of the deviations in the inflow component and the outflow component.

3. The method of claim 1, wherein detecting the one or more causes of the deviation comprises:
monitoring temporal trends of the model parameters; and
detecting model parameters with consistent variation trends and realistic ranges.

4. The method of claim 1, further comprising:
automatically notifying an operator of the one or more causes of the deviation.

5. The method of claim 1, further comprising:
performing a corrective action in the well system based on one or more of the causes of the deviation determined by the well performance model.

6. The method of claim 5, wherein a timing of the corrective action is advised by the well performance model based on quantifying a production uplift incentive.

7. The method of claim 1, wherein for a mature well, a well performance history is used to determine a set of causes for potential well performance deviation.

8. The method of claim 1, wherein for an immature well or a well with an unknown well performance history, initial well performance deviation parameters are initially selected from all potential parameters, and further comprising reducing the well performance deviation parameters based on subsequent well performance analyses and findings.

9. The method of claim 1, wherein the analysis is formulated using a plurality of inverse optimization formulations that minimize a deviation in values for the model parameters based on the well performance model and well test production data of down-hole gauge pressures.

10. The method of claim 9, wherein the one or more inverse optimization formulations are solved by at least one of the following methods:
point-wise processing of each well test individually; and
time series processing of a sequence of well tests.

11. The method of claim 10, wherein the one or more inverse optimization formulations are solved by time series processing of a sequence of well tests, using well test production data taken after the last corrective action taken for the well system.

12. The method of claim 1, wherein steps c), d), and e) use both of the following methods to mitigate data noise and model imperfections:
point-wise processing of each well test individually; and
time series processing of a sequence of well tests.

13. The method of claim 1, wherein if an existing cause for performance degradation is known to exist, an additional pressure drop due to said existing cause is calculated and subtracted from the deviation.

14. The method of claim 1, wherein the method is performed for a production well.

15. The method of claim 1, wherein the method is performed for an injection well.

16. The method of claim 1, wherein the possible causes of the deviation in the model parameters associated with the outflow component includes at least one of:
restrictions in a tubing impacting the tubing effective internal diameter;
localized restriction in a tubing due to scale build-up within the tubing;
inefficiencies in an artificial lifting equipment or operation;
holes in a tubing;
excessive liquid loading in the well system; and
problems with a lift pump.

17. The method of claim 1, wherein the possible causes of the deviation of the model parameters associated with the inflow component includes at least one of:

increase in skin value;
reduction in permeability;
reduction of reservoir pressure;
restrictions in perforations;
changes in partial penetration; and
changes in effective length of completions.

18. An automated method for well performance management of a well system in a hydrocarbon reservoir and detecting performance degradation events in a well in the well system, comprising the steps of:

a) inputting well test production data into a well performance model, the well performance model comprised of model parameters, the model parameters comprising one or more reservoir properties, the well performance model further comprising
an inflow component modeling a pressure drop for hydrocarbon fluids flowing from a reservoir to the well, and
an outflow component modeling a pressure drop for hydrocarbon fluids flowing in and along tubing in the well to a surface;

b) calculating a downhole model pressure based on the well performance model;

c) continuously comparing the calculated downhole model pressure with a real-time measured downhole pressure;

d) determining if there is a deviation between the calculated downhole model pressure and the real-time measured downhole pressure, and if there is a deviation, performing an analysis, by the well performance model, on the model parameters to determine one or more potential attributing causes for the deviation, wherein the analysis is formulated using one or more inverse optimization formulations that minimize a deviation in values for the model parameters based on the well performance model and well test production data of down-hole gauge pressures, and wherein one of the inverse optimization formulations minimizes the squared error between the down-hole gauge pressures of the outflow component based on the well performance model and the well test production data using the following equation:

$$\min_{x \in X}(f(x) - P_g)^2;$$

e) inferring from the analysis on the plurality of parameters one or more causes of the deviation to improve hydrocarbon resources recovery; and f) changing a reservoir pressure by increasing an injection fluid rate of an injection well or decreasing the injection fluid rate of the injection well responsive to the inferring one or more causes of deviation.

* * * * *